United States Patent
Kim et al.

(10) Patent No.: US 9,859,334 B2
(45) Date of Patent: Jan. 2, 2018

(54) DISPLAY APPARATUS

(71) Applicant: SAMSUNG DISPLAY CO., LTD., Yongin-si, Gyeonggi-do (KR)

(72) Inventors: Keonwoo Kim, Yongin-si (KR); Deukjong Kim, Yongin-si (KR)

(73) Assignee: Samsung Display Co., Ltd., Yongin-si, Gyeonggi-do (KR)

(*) Notice: Subject to any disclaimer, the term of this patent is extended or adjusted under 35 U.S.C. 154(b) by 0 days.

(21) Appl. No.: 15/416,497

(22) Filed: Jan. 26, 2017

(65) Prior Publication Data

US 2017/0345847 A1 Nov. 30, 2017

(30) Foreign Application Priority Data

May 27, 2016 (KR) .................. 10-2016-0065708

(51) Int. Cl.
*H01L 27/00* (2006.01)
*H01L 27/24* (2006.01)
*H01L 27/12* (2006.01)
*H01L 27/32* (2006.01)

(52) U.S. Cl.
CPC ........ *H01L 27/2418* (2013.01); *H01L 27/124* (2013.01); *H01L 27/326* (2013.01); *H01L 27/3244* (2013.01); *H01L 27/3276* (2013.01); *H01L 27/3297* (2013.01)

(58) Field of Classification Search
CPC ............... H01L 27/3244; H01L 27/326; H01L 27/3276; H01L 27/3297
See application file for complete search history.

(56) References Cited

U.S. PATENT DOCUMENTS

| | | | |
|---|---|---|---|
| 6,762,564 B2 | 7/2004 | Noguchi et al. | |
| 8,188,941 B2 | 5/2012 | Iida et al. | |
| 8,536,580 B2 | 9/2013 | Kang | |
| 9,117,768 B2 | 8/2015 | Cho et al. | |
| 9,287,342 B2 | 3/2016 | Kwon et al. | |
| 2014/0097415 A1* | 4/2014 | Byun ................ | H05B 33/0896 257/40 |
| 2014/0145588 A1 | 5/2014 | Oh et al. | |
| 2015/0097178 A1 | 4/2015 | Yamazaki et al. | |

(Continued)

FOREIGN PATENT DOCUMENTS

| | | |
|---|---|---|
| JP | 2003-330387 A | 11/2003 |
| JP | 2005-031651 A | 2/2005 |

(Continued)

*Primary Examiner* — Ngan Ngo
(74) *Attorney, Agent, or Firm* — Lee & Morse, P.C.

(57) ABSTRACT

A display apparatus includes a protective layer, a substrate including a non-display area adjacent to a display area, and a sub-pixel in the display area and including a conductive layer, an inorganic insulating layer on the conductive layer, an organic insulating layer on the inorganic insulating layer, and a display device connected to the conductive layer. The display apparatus further includes a power supply line including a first power supply line and a second power supply line electrically connected to the sub-pixel; and an insulating dam as at least one layer in the non-display area. The non-display area includes the insulating dam, the power supply line are placed, and a spaced area which does not include the organic insulating layer. The protective layer covers an exposed portion of the power supply line.

20 Claims, 9 Drawing Sheets

(56) References Cited

U.S. PATENT DOCUMENTS

| | | |
|---|---|---|
| 2016/0164034 A1 | 6/2016 | Huh et al. |
| 2017/0179432 A1* | 6/2017 | Visweswaran ...... H01L 51/5256 |
| 2017/0229664 A1* | 8/2017 | Watabe ............... H01L 51/0097 |
| 2017/0237027 A1* | 8/2017 | Lee .................... H01L 51/0097 |

FOREIGN PATENT DOCUMENTS

| | | |
|---|---|---|
| JP | 2008-129157 A | 6/2008 |
| KR | 10-2013-0005877 A | 1/2013 |
| KR | 10-2014-0071552 A | 6/2014 |
| KR | 10-2015-0004536 A | 1/2015 |
| KR | 10-2015-0044721 A | 4/2015 |
| KR | 10-2015-0074808 A | 7/2015 |

* cited by examiner

DISPLAY APPARATUS

CROSS-REFERENCE TO RELATED APPLICATION

Korean Patent Application No. 10-2016-0065708, filed on May 27, 2016, and entitled, "Display Apparatus," is incorporated by reference herein in its entirety.

BACKGROUND

1. Field

One or more embodiments relate to a display apparatus.

2. Description of the Related Art

A variety of electronic products have been developed with displays. Examples include smartphones, laptop computers, digital cameras, camcorders, portable information terminals, or tablet personal computers, desktop computers, televisions, outdoor advertisement boards, and heads-up displays. Recently, slimmer, flexible displays have been developed. One example is an organic light-emitting display that bends or flexes in in one direction.

SUMMARY

In accordance with one or more embodiments, a display apparatus includes a protective layer; a substrate including a non-display area adjacent to a display area; a sub-pixel in the display area and including a conductive layer, an inorganic insulating layer on the conductive layer, an organic insulating layer on the inorganic insulating layer, and a display device connected to the conductive layer; a power supply line including a first power supply line and a second power supply line electrically connected to the sub-pixel; and an insulating dam as at least one layer in the non-display area, wherein the non-display area includes the insulating dam, the power supply line, and a spaced area which does not include the organic insulating layer and wherein the protective layer covers an exposed portion of the power supply line.

The spaced area may correspond to an open area between an area of the organic insulating layer and an area of the insulating dam, and the exposed portion of the power supply line may be exposed in the spaced area. The protective layer may cover the exposed portion of the power supply line which extends to the spaced area.

The different voltages may be applied to the first power supply line and the second power supply line, an edge portion of the first power supply line and an edge portion of the second power supply line may be exposed in the spaced area, and the protective layer selectively may cover the exposed edge portion of the first power supply line and the exposed edge portion of the second power supply line.

The protective layer may extend from each of the exposed edge portions of the first and second power supply lines and covers all of the first power supply line, the second power supply line, the organic insulating layer, and the insulating dam arranged in one direction with respect to the substrate.

The power supply line may be on a same layer as the conductive layer, and the protective layer may be on a same layer as the inorganic insulating layer that covers the conductive layer. The conductive layer may include a first conductive layer and a second conductive layer above the first conductive layer, the organic insulating layer may include a first organic insulating layer between the first conductive layer and the second conductive layer and a second organic insulating layer on the second conductive layer, and the inorganic insulating layer may be between the first conductive layer and the first organic insulating layer, the power supply line in the spaced area may be on a same layer as the first conductive layer, and the protective layer may be on a same layer as the inorganic insulating layer that covers the first conductive layer.

The power supply line may have a single-conductive layer structure that includes at least one conductive portion on a same layer as the first conductive layer. The power supply line may include a first conductive part that includes titanium (Ti), a second conductive part on the first conductive part and including aluminum (Al), and a third conductive part on the second conductive part and including titanium (Ti).

The protective layer may have a single-layer structure on a same layer as the inorganic insulating layer that covers the first conductive layer. The insulating dam may include a plurality of dams that are spaced apart from each other.

The insulating dam may be on a same layer as a plurality of organic insulating layers which include one or more of a first planarization layer corresponding to the first organic insulating layer covering the first conductive layer, a second planarization layer corresponding to the second organic insulating layer covering the second conductive layer, a pixel defining layer corresponding to a third organic insulating layer defining the sub-pixel, or a spacer corresponding to a fourth organic insulating layer placed along the sub-pixel, and the plurality of organic insulating layers may be stacked in a vertical direction with respect to the substrate. The dams may have heights that increase toward an edge of the substrate.

The first conductive layer may be above the substrate, the inorganic insulating layer may be on the first conductive layer and includes an opening exposing a portion of the first conductive layer, the first organic insulating layer may be on the inorganic insulating layer and may include an opening exposing the portion of the first conductive layer, the second conductive layer may be on the first organic insulating layer, and the second organic insulating layer may be on the second conductive layer and includes an opening through which the second conductive layer is electrically connected to the display device.

The display apparatus may include, above the substrate, a thin film transistor including an active layer including a source region, a drain region, and a channel region connecting the source region to the drain region; and gate electrode above the active layer and insulated from the active layer, wherein the first conductive layer is electrically connected to one of the source region or the drain region.

The display apparatus may include, above the substrate, a pixel electrode connected to the second conductive layer; an intermediate layer on the pixel electrode and including an emission layer; and an opposite electrode on the intermediate layer. The first power supply line may include a first main line corresponding to the display area and a first connection line extending from the first main line in a first direction, and the second power supply line may include a second main line surrounding different ends of the first main line and other areas of the display area and a second connection line extending from the second main line in the first direction.

In accordance with one or more other embodiments, a display apparatus includes a display area; a non-display area; a first dam in the non-display area; a power supply line for the display area; and a protective layer in the non-display area, the protective layer covering a portion of the power supply line not covered by the first dam in the non-display area. The first dam may have a height sufficient to block material encapsulating the display area DA from to a side each of the non-display area. The display apparatus may include a second dam in the non-display area, wherein the protective layer covers the power supply line in an area between the first and second dams.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
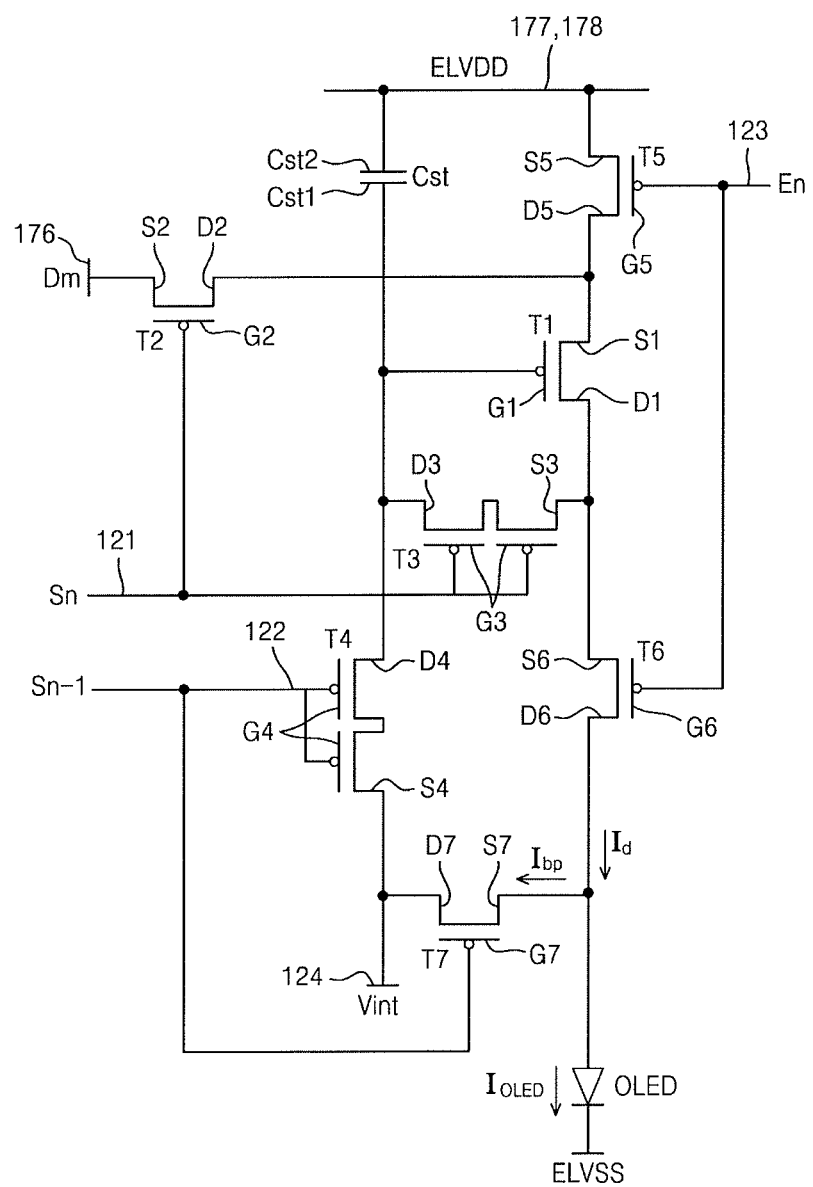
FIG. 1 illustrates an embodiment of a sub-pixel of a display apparatus.

Example embodiments will now be described with reference to the accompanying drawings; however, they may be embodied in different forms and should not be construed as limited to the embodiments herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Some embodiments may correspond to an active matrix (AM) type organic light-emitting display apparatus having a 7Tr-1Cap structure (e.g., 7 thin film transistors (TFTs) and 1 capacitor) in one sub-pixel. Other embodiments may have a different structure. For example, embodiments of an organic light-emitting display apparatus may include a plurality of TFTs and one or more capacitors in one sub-pixel and may have one of various structures in which a separate wire may be further formed, a wire may be omitted, or the like. The organic light-emitting display apparatus may include a plurality of sub-pixels that are respectively minimum units for displaying an image. Each pixel may include a plurality of sub-pixels.

FIG. 1 illustrates an embodiment of a sub-pixel which is representative of sub-pixels in a display apparatus. The display apparatus may be, for example, an organic light-emitting display apparatus.

Referring to FIG. 1, the sub-pixel includes a plurality of signal lines, a plurality of TFTs connected to the signal lines, a storage capacitor Cst, and an organic light-emitting device OLED. The signal lines may be shared among a plurality of sub-pixels.

The TFTs include a driving TFT T1, a switching TFT T2, a compensation TFT T3, an initialization TFT T4, a driving control TFT T5, an emission control TFT T6, and a bypass TFT T7.

The signal lines include a scan line 121 to provide a scan signal Sn, a previous scan line 122 to deliver a previous scan signal Sn−1 to the initialization TFT T4 and the bypass TFT T7, an emission control line 123 to deliver an emission control signal En to the driving control TFT T5 and the emission control TFT T6, a data line 176 to deliver a data signal Dm, first power supply lines 177 and 178 that are substantially parallel to the data line 176 and that deliver a driving voltage ELVDD, and an initialization voltage line 124 to deliver an initialization voltage Vint to initialize the driving TFT T1. The first power supply lines 177 and 178 may be lower power supply line 177 and the upper power supply line 178 on different layers. The lower power supply line 177 may be electrically connected to the upper power supply line 178.

The driving TFT T1 includes a gate electrode G1 connected to a first storage capacitor plate 125a of the storage capacitor Cst, a source electrode S1 connected to the first power supply lines 177 and 178 via the driving control TFT T5, and a drain electrode D1 electrically connected to a pixel electrode of the organic light-emitting device OLED via the emission control TFT T6. The driving TFT T1 may receive the data signal Dm, according to a switching operation by the switching TFT T2, in order to supply emission current $O_{OLED}$ to the organic light-emitting device OLED.

The switching TFT T2 includes a gate electrode G2 connected to the scan line 121, a source electrode S2 connected to the data line 176, a drain electrode D2 connected to the source electrode S1 of the driving TFT T1 and to the first power supply lines 177 and 178 via the driving control TFT T5. The switching TFT T2 may be turned on according to the scan signal Sn from the scan line 121 and may perform a switching operation to deliver the data signal Dm through the data line 176 to the source electrode S1 of the driving TFT T1.

The compensation TFT T3 includes a gate electrode G3 connected to the scan line 121, a source electrode S3 connected to the drain electrode D1 of the driving TFT T1 and thus connected to a pixel electrode 191 (e.g., refer to FIG. 4) of the organic light-emitting device OLED via the emission control TFT T6, and a drain electrode D3 connected to the first storage capacitor plate 125a of the storage capacitor Cst, a drain electrode D4 of the initialization TFT T4, and the gate electrode G1 of the driving TFT T1. The compensation TFT T3 may be turned on according to the scan signal Sn from the scan line 121 and may diode-connect the driving TFT T1 by electrically connecting the gate electrode G1 to the drain electrode D1 of the driving TFT T1.

The initialization TFT T4 includes a gate electrode G4 connected to the previous scan line 122, a source electrode S4 connected to a drain electrode D7 of the bypass TFT T7 and the initialization voltage line 124, and the drain electrode D4 connected to the first storage capacitor plate 125a of the storage capacitor Cst, the drain electrode D3 of the compensation TFT T3, and the gate electrode G1 of the driving TFT T1. The initialization TFT T4 may be turned on according to the previous scan signal Sn−1 from the previous scan line 122 and may deliver the initialization voltage Vint to the gate electrode G1 of the driving TFT T1 in order to perform an initialization operation to initialize a voltage of the gate electrode G1 of the driving TFT T1.

The driving control TFT T5 includes a gate electrode G5 connected to the emission control line 123, a source electrode S5 connected to the first power supply lines 177 and 178, and a drain electrode D5 connected to the source electrode S1 of the driving TFT T1 and the drain electrode D2 of the switching TFT T2.

The emission control TFT T6 includes a gate electrode G6 connected to the emission control line 123, a source electrode S6 connected to the drain electrode D1 of the driving TFT T1 and the source electrode S3 of the compensation TFT T3, and a drain electrode D6 electrically connected to a source electrode S7 of the bypass TFT T7 and the pixel electrode 191 (e.g., refer to FIG. 4) of the organic light-emitting device OLED. The driving control TFT T5 and the emission control TFT T6 are simultaneously turned on according to the emission control signal En from the emission control line 123 in order to allow the emission current $I_{OLED}$ to flow to the organic light-emitting device OLED based on the driving voltage ELVDD to the organic light-emitting device OLED.

The bypass TFT T7 includes a gate electrode G7 connected to the previous scan line 122, the source electrode S7 connected to the drain electrode D6 of the emission control TFT T6 and the pixel electrode 191 (e.g., refer to FIG. 4) of the organic light-emitting device OLED, and the drain electrode D7 connected to the initialization voltage line 124. The bypass TFT T7 may deliver the previous scan signal Sn−1 through the previous scan line 122 to the gate electrode G7. The previous scan signal Sn−1 indicates a voltage having a predetermined level to turn off the bypass TFT T7. When the bypass TFT T7 is turned off, a portion of driving current $I_d$ may flow as bypass current $I_{bp}$ via the bypass TFT T7.

Referring to FIG. 1, the initialization TFT T4 and the bypass TFT T7 may be connected, for example, to the previous scan line 122.

A second storage capacitor plate Cst2 of the storage capacitor Cst may be connected to the first power supply lines 177 and 178. An opposite electrode 193 (e.g., refer to FIG. 4) of the organic light-emitting device OLED may be connected to a common voltage ELVSS. Accordingly, the organic light-emitting device OLED may emit light based on the emission current $I_{OLED}$ received from the driving TFT T1 and thus may display an image. The compensation TFT T3 and the initialization TFT T4 may have, for example, dual-gate electrodes.

Figure 2:
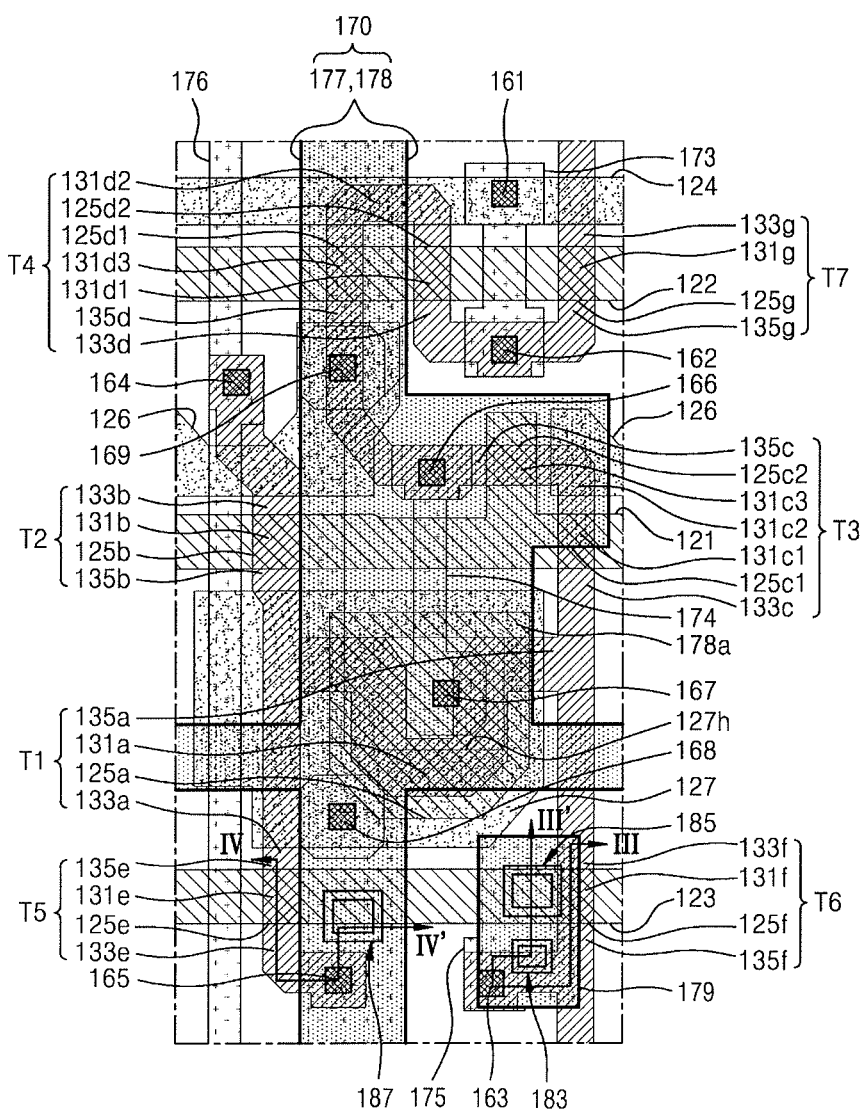
FIG. 2 illustrates a layout embodiment of the sub-pixel.

FIG. 2 illustrate layout embodiment of the sub-pixel in FIG. 1. A plurality of semiconductor layers and a plurality of conductive layers may be placed in one sub-pixel, insulating layers may be respectively interposed between devices on different layers, and contact holes may be formed in some of the insulating layers so that the conductive layers on different layers may be electrically connected to each other.

The sub-pixel of the organic light-emitting display apparatus includes the scan line 121, the previous scan line 122, the emission control line 123, and the initialization voltage line 124 arranged along a row direction and that respectively provide the scan signal Sn, the previous scan signal Sn−1, the emission control signal En, and the initialization voltage Vint to the sub-pixel.

The sub-pixel of the organic light-emitting display apparatus may include the data line 176, and a first power supply line 170 including the lower and upper power supply lines 177 and 178 which cross the scan line 121, the previous scan line 122, the emission control line 123, and the initialization voltage line 124 and respectively apply the data signal Dm and the driving voltage ELVDD to the sub-pixel.

Figure 4:
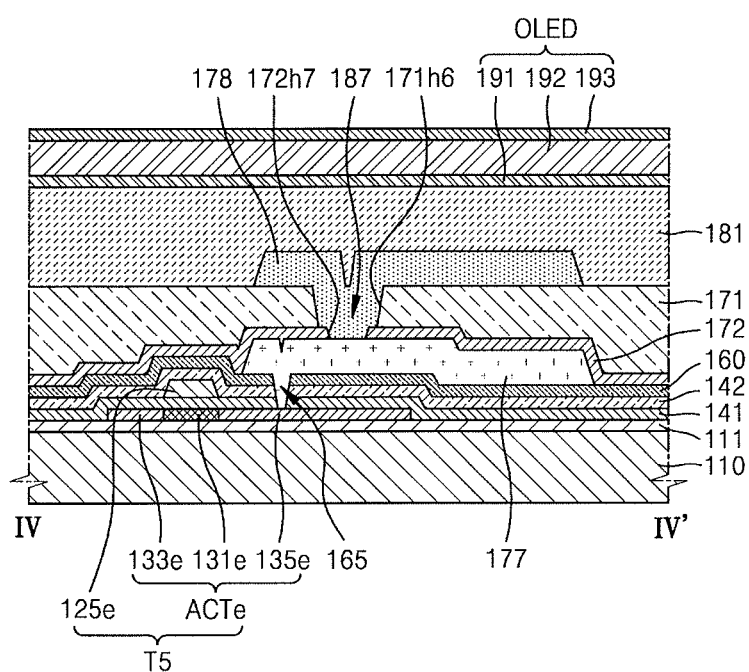
FIG. 4 illustrates a view of the sub-pixel along section line IV-IV' in FIG. 2.

The sub-pixel may include the driving TFT T1, the switching TFT T2, the compensation TFT T3, the initialization TFT T4, the driving control TFT T5, the emission control TFT T6, the bypass TFT T7, the storage capacitor Cst, and the organic light-emitting device OLED (e.g., refer to FIG. 4).

The driving TFT T1, the switching TFT T2, the compensation TFT T3, the initialization TFT T4, the driving control TFT T5, the emission control TFT T6, and the bypass TFT T7 are formed with an active layer having a curved shape. The active layer may include a driving active layer corresponding to the driving TFT T1, a switching active layer corresponding to the switching TFT T2, a compensation active layer corresponding to the compensation TFT T3, an initialization active layer corresponding to the initialization TFT T4, an operation control active layer ACTe (e.g., refer to FIG. 4) corresponding to the driving control TFT T5, an emission control active layer ACTf (e.g., refer to FIG. 3) corresponding to the emission control TFT T6, and a bypass active layer corresponding to the bypass TFT T7.

The active layer may include, for example, polysilicon. Also, the active layer may include a channel region, and a source region and a drain region. The channel region is not doped with impurities and thus has semiconductor characteristics. The source and drain regions are on different sides of the channel region and are doped with impurities and thus have conductivity. The impurity used (e.g., an N-type or P-type impurity) may vary depending on the type of a TFT.

The doped source region or the doped drain region may corresponding to the source electrode or drain electrode of a TFT. For example, a driving source electrode may correspond to a driving source region 133a doped with impurities in a periphery of a driving channel region 131a of the driving active layer. A driving drain electrode may correspond to a driving drain region 135a doped with impurities in a periphery of the driving channel region 131a. Portions of the active layer between the TFTs may be wires doped with impurities and thus function to electrically connect the TFTs.

The storage capacitor Cst may be in the sub-pixel. The storage capacitor Cst may include the first storage capacitor plate 125a and a second storage capacitor plate 127 with the second insulating layer 142 (e.g., refer to FIG. 3) therebetween. The first storage capacitor plate 125a may also function as a driving gate electrode 125a. For example, the driving gate electrode 125a and the first storage capacitor plate 125a may be one body.

The first storage capacitor plate 125a may have an island form spaced apart from an adjacent sub-pixel. The first storage capacitor plate 125a may include the same material layer as the scan line 121, the previous scan line 122, and the emission control line 123.

The second storage capacitor plate 127 may extend over adjacent sub-pixels and include the same material layer as the initialization voltage line 124 and/or a shield layer 126. A storage opening 127h may be formed in the second storage capacitor plate 127. The first storage capacitor plate 125a and a drain region 135c of the compensation TFT T3 may be electrically connected to each other using a connection member 174, via the storage opening 127h. The second storage capacitor plate 127 may be connected to the power supply line 177 via a contact hole 168 in an interlayer insulating layer 160.

The driving TFT T1 includes the driving active layer and the driving gate electrode 125a. The driving active layer includes the driving source region 133a, the driving drain region 135a, and the driving channel region 131a connecting the driving source region 133a and the driving drain region 135a. The driving gate electrode 125a may also function as the first storage capacitor plate 125a. The driving channel region 131a of the driving active layer may planarly overlap the gate electrode 125a. The driving source region 133a and the driving drain region 135a may be placed in different directions with respect to the driving channel region 131a. A driving source region 133a of the driving TFT T1 may be connected to a switching drain region 135b and an operation control drain region 135e. A driving drain region 135a may be connected to a compensation source region 133c and an emission control source region 133f.

The switching TFT T2 includes the switching active layer and the switching gate electrode 125b. The switching active layer includes a switching channel region 131b, a switching source region 133b, and a switching drain region 135b. The switching source region 133b may be electrically connected to the data line 176 via a contact hole 164 in a first insulating layer 141, a second insulating layer 142, and the interlayer insulating layer 160 (e.g., refer to FIG. 3). The switching TFT T2 may be used as a switching device to select an emission target sub-pixel. The switching gate electrode 125b may be connected to the scan line 121, the switching source region 133b may be connected to the data line 176, and the switching drain region 135b may be connected to the driving TFT T1 and the driving control TFT T5.

The compensation TFT T3 includes the compensation active layer and compensation gate electrodes 125c1 and 125c2. The compensation active layer includes compensation channel regions 131c1, 131c2, and 131c3, a compensation source region 133c, and a compensation drain region 135c. The compensation gate electrodes 125c1 and 125c2 are dual-gate electrodes including the first compensation electrode 125c1 and the second compensation electrode 125c2, and may function to prevent or decrease leakage current.

The compensation drain region 135c of the compensation TFT T3 may be connected to the first storage capacitor plate 125a via the connection member 174. The compensation channel regions 131c1, 131c2, and 131c3 may include a portion 131c1 corresponding to the first compensation electrode 125c1, the portion 131c3 corresponding to the second compensation electrode 125c2, and the portion 131c2 between the portions 131c1 and 131c3.

Figure 3:
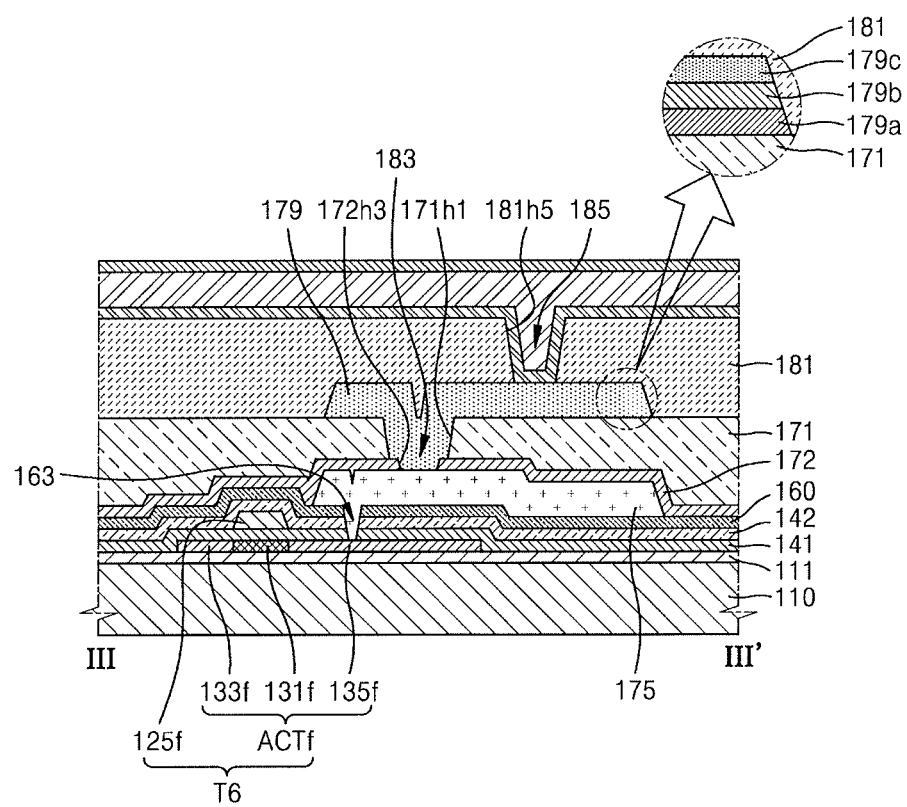
FIG. 3 illustrates a view of the sub-pixel along section line in FIG. 2.

The shield layer 126 may be formed from the same material layer as the initialization voltage line 124 and the second storage capacitor plate 127, may be placed on the portion 131c2, and may be connected to the lower power supply line 177 via a contact hole 169 in the interlayer insulating layer 160 (e.g., refer to FIG. 3). The portion 131c2 between the two portions 131c1 and 131c3 is doped with impurities and then has conductivity. Thus, if the shield layer 126 is not arranged, the data line 176 adjacent to the portion 131c2 may form a parasitic capacitor. Since the data line 176 applies data signals having different strengths, according to the resolution to be realized in a sub-pixel, the amount of parasitic capacitance may be changed accordingly. Since the compensation TFT T3 is electrically connected to the driving TFT T1, when the amount of the parasitic capacitor in the compensation TFT T3 is changed, the driving current $I_d$ and the emission current $I_{OLED}$ are changed, so the resolution of light emitted from the sub-pixel may be changed.

However, if the shield layer 126 connected to the power supply line 177 and thus a constant voltage is applied thereto is arranged on the portion 131c2 between the portions 131c1 and 131c3, the portion 131c2 and the shield layer 126 may form a parasitic capacitor having a substantially constant amount of capacitance. The amount of parasitic capacitance may be significantly greater than the parasitic capacitance formed by the portion 131c2 and the data line 176. Thus, the amount change of the parasitic capacitance due to a change in a data signal applied to the data line 176 may be very small compared to the amount of the parasitic capacitance formed by the portion 131c2 and the shield layer 126, and, in some cases, may be at a negligible level. Therefore, it is possible to prevent a change of a resolution of light emitted from the sub-pixel caused by the amount change of the parasitic capacitance.

The connection member 174 may include the same material layer as the data line 176 and the lower power supply line 177. The connection member 174 may have a first end connected to the compensation drain region 135c and an initialization drain region 135d via a contact hole 166 in the first insulating layer 141, the second insulating layer 142, and the interlayer insulating layer 160, and a second end connected to the first storage capacitor plate 125a via a contact hole 167 in the second insulating layer 142 and the interlayer insulating layer 160. The second end of the connection member 174 may be connected to the first storage capacitor plate 125a via the storage opening 127h in the second storage capacitor plate 127.

The initialization TFT T4 includes the initialization active layer ACTd and the initialization gate electrodes 125d1 and 125d2. The initialization active layer ACTd includes initialization channel regions 131d1, 131d2, and 131d3, an initialization source region 133d, and an initialization drain region 135d. The initialization gate electrodes 125d1 and 125d2 are dual-gate electrodes, including the first initialization gate electrode 125d1 and the second initialization gate electrode 125d2, which function to prevent or decrease leakage current. The initialization channel regions 131d1, 131d2, and 131d3 includes the region 131d1 corresponding to the first initialization gate electrode 125d1, the region 131d2 corresponding to the second initialization gate electrode 125d2, and the region 131d3 therebetween.

The initialization source region 133d is connected to the initialization voltage line 124 via an initialization connection line 173. The initialization connection line 173 has a first end connected to the initialization voltage line 124 via a contact hole 161 in the second insulating layer 142 and the interlayer insulating layer 160 (e.g., refer to FIG. 3), and a second end of the initialization connection line 173 connected to the initialization source region 133*d* via a contact hole 162 in the first insulating layer 141, second insulating layer 142, and the interlayer insulating layer 160 (e.g., refer to FIG. 3).

The driving control TFT T5 includes the operation control active layer ACTe (e.g., refer to FIG. 4) and an operation control gate electrode 125*e*. The operation control active layer ACTe includes an operation control channel region 131*e*, an operation control source region 133*e*, and the operation control drain region 135*e*. The operation control source region 133*e* may be electrically connected to the lower power supply line 177 via a contact hole 165 in the first insulating layer 141, the second insulating layer 142, and the interlayer insulating layer 160 (e.g., refer to FIG. 3).

The emission control TFT T6 includes the emission control active layer ACTf and an emission control gate electrode 125*f*. The emission control active layer ACTf includes an emission control channel region 131*f*, the emission control source region 133*f*, and an emission control drain region 135*f*. A first conductive layer 175 may be above the emission control TFT T6 and connected to the emission control drain region 135*f* of the emission control active layer ACTf via a contact hole 163 in the first insulating layer 141, the second insulating layer 142, and the interlayer insulating layer 160 (e.g., refer to FIG. 3). The first conductive layer 175 may be formed from the same material layer as the data line 176 and the lower power supply line 177. The first conductive layer 175 may be electrically connected to a second conductive layer 179, and thus may be electrically connected to the pixel electrode 191 (e.g., refer to FIG. 4) of the organic light-emitting device OLED.

The bypass TFT T7 includes the bypass active layer and a bypass gate electrode 125*g*. The bypass active layer includes a bypass source region 133*g*, a bypass drain region 135*g*, and a bypass channel region 131*g*. The bypass drain region 135*g* is connected to the initialization source region 133*d* of the initialization TFT T4, so that the bypass drain region 135*g* may be connected to the initialization voltage line 124 via the initialization connection line 173. The bypass source region 133*g* may be electrically connected to the pixel electrode 191 (e.g., refer to FIG. 4) of the organic light-emitting device OLED.

The second conductive layer 179 may be above the first conductive layer 175 and may be electrically connected to the first conductive layer 175 via a contact hole 183 in a first organic insulating layer 171 (e.g., refer to FIG. 3). The pixel electrode 191 (e.g., refer to FIG. 4) of the organic light-emitting device OLED may be above the second conductive layer 179 and may be connected to the second conductive layer 179 via a contact hole 185 in a second organic insulating layer 181 (e.g., refer to FIG. 3) between the second conductive layer 179 and the pixel electrode 191. For example, the first conductive layer 175 and the second conductive layer 179 may be intermediate connection layers for connecting the emission control drain region 135*f* of the emission control active layer ACTf (e.g., refer to FIG. 3) with the pixel electrode 191 (e.g., refer to FIG. 4). The second conductive layer 179 may be formed from the same material layer as the upper power supply line 178.

The upper power supply line 178 may be connected to the lower power supply line 177 via a contact hole 187 in the second organic insulating layer 181 (e.g., refer to FIG. 4). The first power supply line 170 may include the lower power supply line 177 electrically connected to the upper power supply line 178. Because of this configuration, an area of the first power supply line 170 in the sub-pixel may be reduced or minimized. As a result, the resistance of the first power supply line 170 may be decreased. Reducing the voltage drop of first power supply line 170 may result in enhancing an image quality.

FIG. 3 is a cross-sectional view of the sub-pixel taken along a line of FIG. 2, and FIG. 4 is a cross-sectional view of the sub-pixel taken along a line IV-IV' of FIG. 2.

Referring to FIGS. 3 and 4, the organic light-emitting display apparatus includes a plurality of sub-pixels. Each sub-pixel includes the first conductive layer 175 above the substrate 110, an inorganic insulating layer 172 on the first conductive layer 175 and including an opening 172*h*3 exposing a portion of the first conductive layer 175, the first organic insulating layer 171 on the inorganic insulating layer 172 and including an opening 171*h*1 exposing the portion of the first conductive layer 175, the second conductive layer 179 on the first organic insulating layer 171 so as to contact the portion of the first conductive layer 175 exposed via the opening 171*h*1, and the second organic insulating layer 181 on the second conductive layer 179 and including an opening 181*h*5 that serves as a passage where the second conductive layer 179 and a display device OLED are electrically connected to each other.

The substrate 110 may include at least one of various materials such as a glass material, a metal material, a plastic material, or the like. According to the present embodiment, the substrate 110 may be a flexible substrate.

The substrate 110 may include a display area DA for displaying an image and a non-display area NDA (e.g., refer to FIG. 5) at a periphery of the display area DA. A plurality of sub-pixels are arranged in the display area DA. FIG. 2 illustrates one sub-pixel arranged in the display area DA of the substrate 110. The plurality of TFTs T1, T2, T3, T4, T5, T6, and T7 (refer to FIG. 2) and the organic light-emitting device OLED connected to at least one of the plurality of TFTs T1, T2, T3, T4, T5, T6, and T7 may be above the substrate 110.

A layout of the first conductive layer 175, the lower power supply line 177 on the same layer as the first conductive layer 175, the second conductive layer 179, and the upper power supply line 178 on the same layer as the second conductive layer 179 will now be described.

The driving control TFT T5 and the emission control TFT T6 are above the substrate 110. Other TFTs in the sub-pixel are not illustrated in FIGS. 3 and 4. Thus, a cross-sectional structure of the sub-pixel of FIG. 2 will now be described with reference to the driving control TFT T5 and the emission control TFT T6.

The driving control TFT T5 may include the operation control active layer ACTe and the operation control gate electrode 125*e*. The emission control TFT T6 may include the emission control active layer ACTf and the emission control gate electrode 125*f*. The respective active layers ACTe and ACTf may include amorphous silicon, polycrystalline silicon, or an organic semiconductor material. The respective active layers ACTe and ACTf may include the respective source regions 133*e* and 133*f*, the respective drain regions 135*e* and 135*f*, and the respective channel regions 131*e* and 131*f* for connecting the source and drain regions. The respective gate electrodes 125*e* and 125*f* are above the respective active layers ACTe and ACTf. Based on a signal applied to the respective gate electrodes 125*e* and 125*f*, the respective source regions 133*e* and 133*f* may be electrically connected with the respective drain regions 135*e* and 135*f*. Each of the gate electrodes 125*e* and 125*f* may be formed as a single layer or a multistack layer in consideration of, example, adhesion with respect to an adjacent layer, planarization of a surface of a stack-target layer, formability, or the like.

In order to insulate the respective active layers ACTe and ACTf from the respective gate electrodes 125e and 125f, the first insulating layer 141 including an inorganic material may be between the active layers ACTe and ACTf and the gate electrodes 125e and 125f. The second insulating layer 142 including the inorganic material may be on the gate electrodes 125e and 125f. The interlayer insulating layer 160 may be on the second insulating layer 142. The interlayer insulating layer 160 may include inorganic material.

A buffer layer 111 including the inorganic material may be between the TFTs T5 and T6 and the substrate 110. The buffer layer 111 may improve planarization of a surface of the substrate 110 or may prevent impurities from the substrate 110 from migrating into the active layers ACTe and ACTf.

The first conductive layer 175 and the lower power supply line 177 may be on the interlayer insulating layer 160 and may be formed as a single layer or a multistack layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), for example, in consideration of conductivity or the like.

In the present embodiment, each of the first conductive layer 175 and the lower power supply line 177 may have a stack structure of titanium (Ti)/aluminum (Al)/titanium (Ti). The first conductive layer 175 may be electrically connected to the emission control drain region 135f of the emission control active layer ACTf via the contact hole 163 in the first insulating layer 141, the second insulating layer 142, and the interlayer insulating layer 160 and is adjacent to the emission control TFT T6. The lower power supply line 177 may be electrically connected to the operation control source region 133e of the operation control active layer ACTe via the contact hole 165 in the first insulating layer 141, the second insulating layer 142, and the interlayer insulating layer 160 and is adjacent to the driving control TFT T5.

The inorganic insulating layer 172 may be above the interlayer insulating layer 160 to cover the first conductive layer 175 and the lower power supply line 177. The first organic insulating layer 171 may be on the inorganic insulating layer 172. The inorganic insulating layer 172 and the first organic insulating layer 171 may continuously extend from a top surface of the first conductive layer 175 to a top surface of the lower power supply line 177.

The inorganic insulating layer 172 may include an inorganic material such as silicon oxide, silicon nitride, silicon oxynitride, or the like. The inorganic insulating layer 172 may cover the first conductive layer 175 and the lower power supply line 177, so that the inorganic insulating layer 172 may prevent metal materials of the first conductive layer 175 and the lower power supply line 177 from being oxidized.

The first organic insulating layer 171 may include an organic material such as benzocyclobutene (BCB), polyimide, hexamethyldisiloxane (HMDSO), or the like, and may planarize a surface of the substrate 110 by resolving a step due to the first conductive layer 175 and the lower power supply line 177. According to the present embodiment, the first organic insulating layer 171 may be a first planarization layer.

The second conductive layer 179 and the upper power supply line 178 may be on the first organic insulating layer 171 and may be formed as a single layer or a multistack layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), in consideration of conductivity or the like.

The second conductive layer 179 may have a stack structure including a first conductive part 179a including titanium (Ti), a second conductive part 179b on the first conductive part 179a and including aluminum (Al), and a third conductive part 179c on the second conductive part 179b and including titanium (Ti). In this regard, the first conductive layer 175 may have a same structure as the second conductive layer 179. In one embodiment, each of the first conductive layer 175 and the second conductive layer 179 may include at least one of various metal materials or may be formed as a combination of various metal materials.

The inorganic insulating layer 172 may include the opening 172h3 exposing the portion of the first conductive layer 175. The first organic insulating layer 171 may include the opening 171h1 exposing the portion of the first conductive layer 175 exposed via the opening 172h3. The second conductive layer 179 may be electrically connected to the first conductive layer 175 via the opening 171h1 and the opening 172h3. The opening 171h1 and the opening 172h3 may be the contact hole 183 to connect the first conductive layer 175 with the second conductive layer 179.

The inorganic insulating layer 172 may further include an opening 172h7 exposing a portion of the lower power supply line 177. The first organic insulating layer 171 may further include an opening 171h6 exposing the portion of the lower power supply line 177 exposed via the opening 172h7. The upper power supply line 178 may be electrically connected with the lower power supply line 177 via the openings 171h6 and 172h7. For example, since the first power supply line 170 is configured to include the lower power supply line 177 and the upper power supply line 178 that are on different layers, the first power supply line 170 may occupy a reduced or minimum area, and a resistance of the first power supply line 170 may be reduced or minimized. The openings 171h6 and 172h7 may be the contact hole 187 to connect the lower power supply line 177 with the upper power supply line 178.

The upper power supply line 178 may include an area 178a that protrudes to an area of the second storage capacitor plate 127 (e.g., refer to FIG. 2), the area planarly overlapping the area 178a, and the upper power supply line 178 may be electrically connected to the lower power supply line 177 via the contact hole 187 in the first organic insulating layer 171 and the inorganic insulating layer 172.

Since the lower power supply line 177 is electrically connected to the second storage capacitor plate 127 via the contact hole 168 (e.g., refer to FIG. 2) in the interlayer insulating layer 160, the upper power supply line 178 may be electrically connected to the second storage capacitor plate 127. For example, the protruding area 178a of the upper power supply line 178 and the second storage capacitor plate 127 may function as one capacitor plate.

Such configuration may interoperate with the driving gate electrode 125a that functions as the first storage capacitor plate 125a (e.g., refer to FIG. 2), thereby providing stable capacitance of the storage capacitor Cst. The storage capacitor Cst may planarly overlap the driving TFT T1 that occupies a large area in the sub-pixel. By doing so, the storage capacitor Cst may occupy a reduced or minimal area in the sub-pixel and may have high capacitance.

The second conductive layer 179 may be on the first organic insulating layer 171. The second organic insulating layer 181 may be on the second conductive layer 179. In this regard, the second organic insulating layer 181 may include the opening 181h5, and the second conductive layer 179 may be electrically connected to the display device OLED via the opening 181h5. The second organic insulating layer 181 may include an organic material such as acryl, benzocyclobutene (BCB), polyimide, hexamethyldisiloxane (HMDSO), or the like.

The organic light-emitting device OLED includes the pixel electrode 191, an intermediate layer 192 on the pixel electrode 191 and including an emission layer, and the opposite electrode 193 on the intermediate layer 192. The organic light-emitting device OLED may be on the second organic insulating layer 181. The pixel electrode 191 may be electrically connected to the emission control drain region 135f of the emission control active layer ACTf via the first conductive layer 175 and the second conductive layer 179. According to the present embodiment, the first organic insulating layer 171 may be a second planarization layer.

The pixel electrode 191 may be a translucent electrode or a reflective electrode. When the pixel electrode 191 is a translucent electrode, the pixel electrode 191 may include a transparent conductive layer. A pixel defining layer that includes an opening exposing at least a portion of the pixel electrode 191 and defines a pixel area may be on the pixel electrode 191. A spacer may be on the pixel defining layer along the sub-pixel. The spacer may firmly set a combination of the substrate 110 and an encapsulation layer.

The emission layer in the intermediate layer 192 may include a small molecule organic material or a polymer organic material. The intermediate layer 192 may also include a functional layer such as a hole transport layer (HTL), a hole injection layer (HIL), an electron transport layer (ETL), and/or an electron injection layer (EIL).

The intermediate layer 192 may have a different structure in another embodiment. The intermediate layer 192 may include a layer that is one body extending over the pixel electrodes 191 in the sub-pixels, respectively, or may include a layer patterned to correspond to each of the pixel electrodes 191.

The opposite electrode 193 may be arranged as one body extending over the sub-pixels and corresponding to the pixel electrodes 191. The opposite electrode 193 may be a translucent electrode or a reflective electrode.

An encapsulating layer to encapsulate the organic light-emitting device OLED may be on the opposite electrode 193. For example, the encapsulating layer may be a thin-film encapsulating layer including an inorganic layer and an organic layer.

Figure 5:
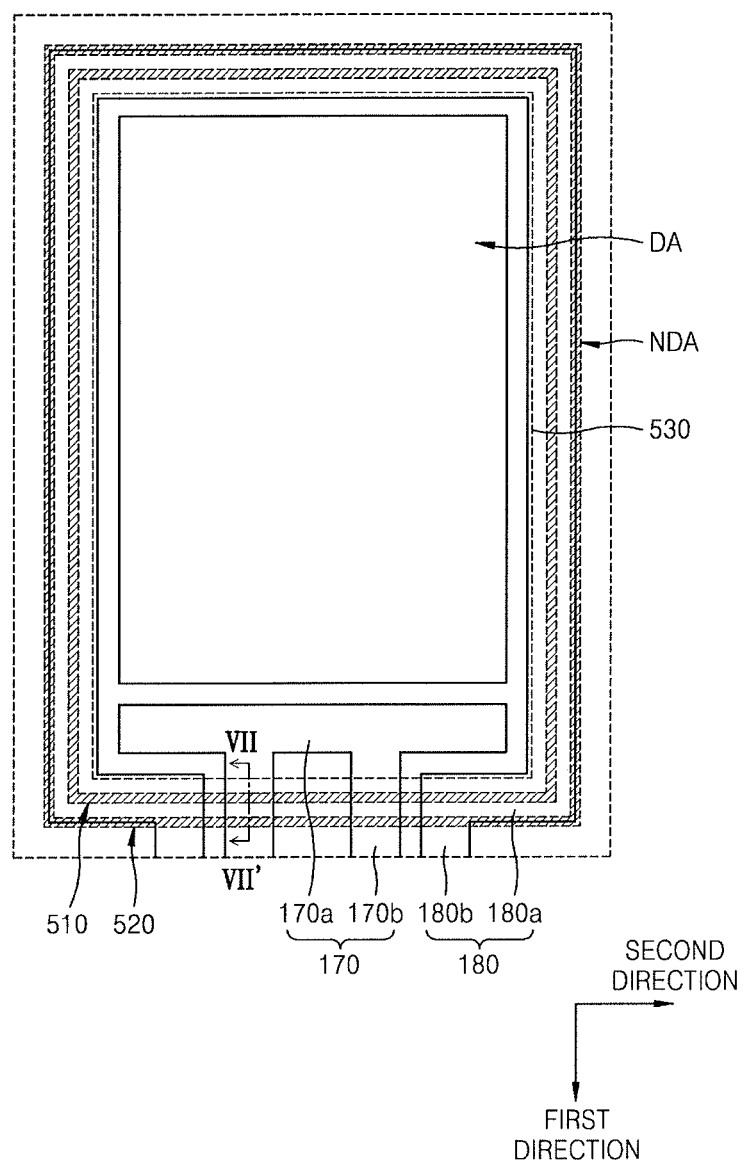
FIG. 5 illustrates an embodiment including an organic insulating layer, power supply lines, and insulating dams.
Figure 6:
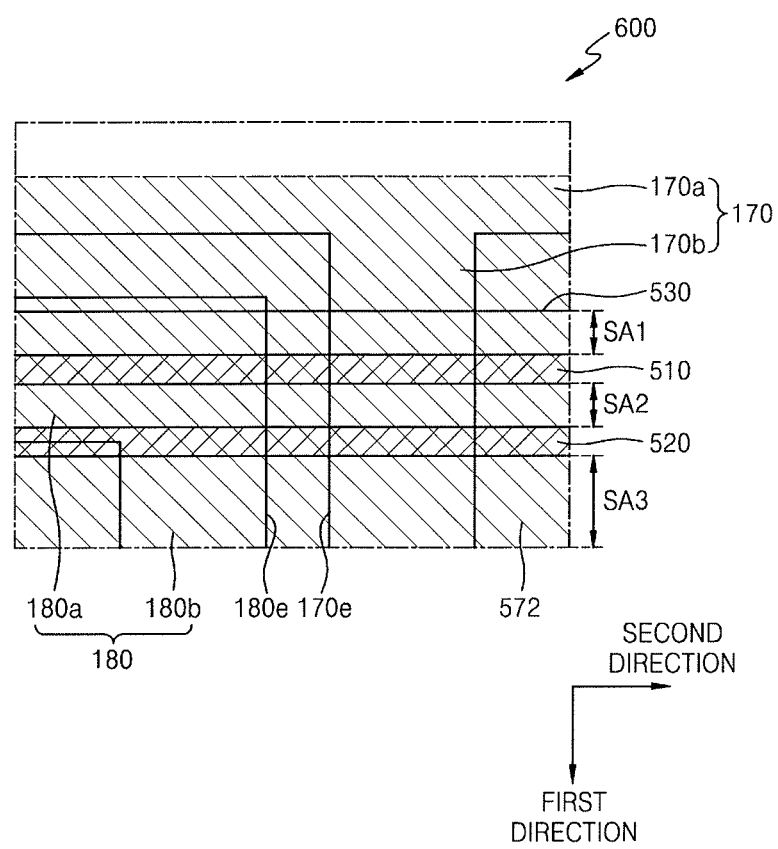
FIG. 6 illustrates an embodiment including an organic insulating layer, power supply lines, insulating dams, and a protective layer.
Figure 7:
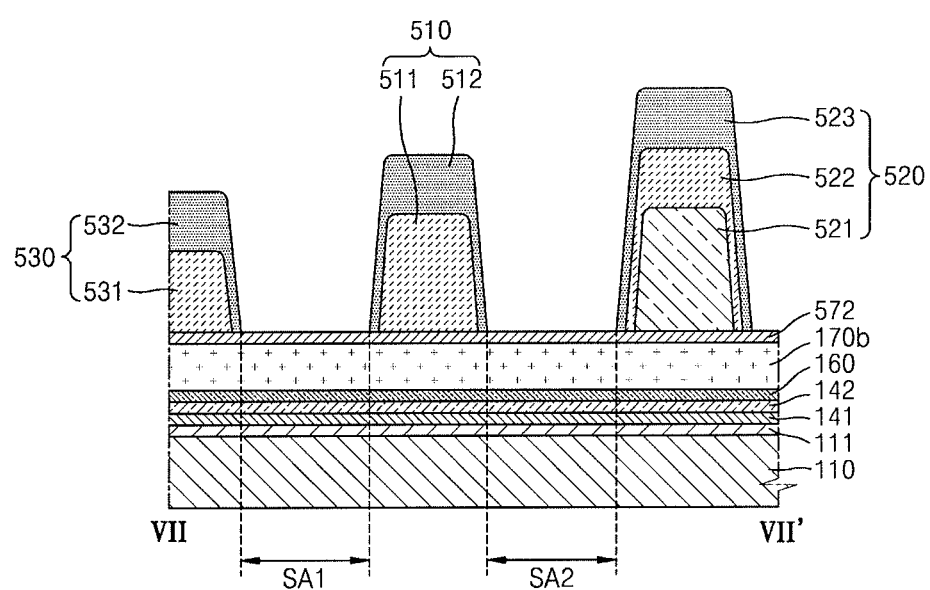
FIG. 7 illustrates a view along section line VII-VIP in FIG. 5.

FIG. 5 illustrates an embodiment including an organic insulating layer 530, power supply lines 170 and 180, and insulating dams 510 and 520 in the display apparatus of FIG. 1. FIG. 6 is a magnified plan view of an embodiment including the organic insulating layer 530, power supply lines 170 and 180, insulating dams 510 and 520, and a protective layer 572. FIG. 7 is a cross-sectional view of the display apparatus taken along a line VII-VII' in FIG. 5.

Referring to FIGS. 5, 6, and 7, the substrate 110 may include the display area DA for displaying an image and the non-display area NDA at a periphery of the display area DA. A plurality of sub-pixels are in the display area DA.

The power supply lines 170 and 180 may be above the substrate 110. The power supply lines 170 and 180 may be the first power supply line 170 and the second power supply line 180. Different voltages may be applied to the first power supply line 170 and the second power supply line 180. In the present embodiment, the first power supply line 170 may be the first power voltage line ELVDD. The second power supply line 180 may be a second power voltage line ELVSS. The second power supply line 180 may be electrically connected to the opposite electrode 193 (e.g., refer to FIG. 4).

The first power supply line 170 may include a first main line 170a and a first connection line 170b arranged to correspond to a side of the display area DA. If the display area DA is rectangular, the first main line 170a may correspond to one side of the display area DA. The first main line 170a may be parallel with one side of the display area DA. The side of the display area DA which corresponds to the first main line 170a may be adjacent to a pad unit.

The first connection line 170b may extend from the first main line 170a in a first direction. The first direction is toward the pad unit from the display area DA. The first connection line 170b may be electrically connected to the pad unit. A portion 170e of a side end of the first power supply line 170 may be exposed.

The second power supply line 180 may include a second main line 180a that surrounds different ends of the first main line 170a and other areas of the display area DA, and a second connection line 180b that extends from the second main line 180a in the first direction. The second connection line 180b may be electrically connected to the pad unit. A portion 180e of a side end of the second power supply line 180 may be exposed. The first connection line 170b and the second connection line 180b may be spaced apart from each other in a second direction. A gap may be present between the first connection line 170b and the second connection line 180b.

The power supply lines 170 and 180 may be placed on a same layer as one of the first or second conductive layers 175 and 179 in the sub-pixel of FIG. 2. In the present embodiment, the power supply lines 170 and 180 may be on a same layer as the first conductive layer 175. The power supply lines 170 and 180 may include a same material as the first conductive layer 175. For example, each of the power supply lines 170 and 180 may have a stack structure including a first conductive part including titanium (Ti), a second conductive part including aluminum (Al), and a third conductive part including titanium (Ti).

The insulating dams 510 and 520 may be, for example, on at least one layer in an outer area of the display area DA. The insulating dams 510 and 520 may surround the display area DA. The insulating dams 510 and 520 may block an organic material for encapsulating the display area DA from flowing toward a side end of the substrate 110. Thus, the insulating dams 510 and 520 may prevent an edge tail of the organic material from being generated.

Spaced areas SA1, SA2, and SA3 without the organic insulating layer 530 may be arranged in a non-display area 600, in which the power supply lines 170 and 180 and the insulating dams 510 and 520 are placed. For example, the organic insulating layer 530 may be on the display area DA. The organic insulating layer 530 may cover a plurality of devices in a sub-pixel. The organic insulating layer 530 may extend over edges of the display area DA. In the present embodiment, the organic insulating layer 530 may cover an edge of the second main line 180a.

The spaced areas SA1, SA2, and SA3 may correspond to gaps between areas where the organic insulating layer 530 and the insulating dams 510 and 520 are placed, and may be arranged in open areas from which the organic insulating layer 530 has been removed. The spaced areas SA1, SA2, and SA3 may be arranged to allow the organic insulating layer 530 to be spaced apart from the insulating dams 510 and 520.

In the present embodiment, the organic insulating layer 530 includes a first layer 531 and a second layer 532 on the first layer 531. The first layer 531 may be placed on a same layer as the second organic insulating layer 181 (e.g., refer to FIG. 3). The second layer 532 may be on a same layer as the pixel defining layer for defining the pixel area. In one embodiment, the organic insulating layer 530 may include a plurality of organic insulating layers in the display area DA. Each of the organic insulating layers in the display area DA may have a single-layer structure or a multilayer structure.

The insulating dams 510 and 520 may be the first insulating dam 510 and the second insulating dam 520 spaced apart from each other. The first insulating dam 510 may be above the second main line 180a of the second power supply line 180. The second insulating dam 520 may cover the other edge of the second main line 180a. Positions of the first insulating dam 510 and the second insulating dam 520 may different in another embodiment.

The first insulating dam 510 includes a first dam part 511 and a second dam part 512 on the first dam part 511. The first dam part 511 may be on the same layer as the second organic insulating layer 181 (e.g., refer to FIG. 3). The second dam part 512 may be on the same layer as an organic insulating layer (e.g., the second layer 532 of FIG. 7) that corresponds to each sub-pixel. The second dam part 512 may further include a spacer along each sub-pixel. The first dam part 511 may be a second planarization layer to cover the second conductive layer 179 (e.g., refer to FIG. 3). The second dam part 512 may be a pixel defining layer for one or more corresponding sub-pixels. The first dam part 511 and the second dam part 512 may be stacked in a vertical direction with respect to the substrate 110.

The second insulating dam 520 includes a first dam part 521, a second dam part 522 on the first dam part 521, and a third dam part 523 on the second dam part 522. The first dam part 521 may be on a same layer as the first organic insulating layer 171 (e.g., refer to FIG. 3). The second dam part 522 may be on a same layer as the second organic insulating layer 181 (e.g., refer to FIG. 3). The third dam part 523 may be on a same layer as the organic insulating layer (e.g., the second layer 532 of FIG. 7) that corresponds to each sub-pixel.

The third dam part 523 may further include a spacer along each sub-pixel. The first dam part 521 may be a first planarization layer for covering the first conductive layer 175 (e.g., refer to FIG. 3). The second dam part 522 may be a second planarization layer for covering the second conductive layer 179 (e.g., refer to FIG. 3). The third dam part 523 may be a pixel defining layer for defining each sub-pixel. The first dam part 521, the second dam part 522, and the third dam part 523 may be stacked in the vertical direction with respect to the substrate 110. In one embodiment, each of the insulating dams 510 and 520 may include at least one organic insulating layer.

The first insulating dam 510 and the second insulating dam 520 may be spaced apart from each other in the vertical direction with respect to the substrate 110. The height of the insulating dams 510 and 520 may increase toward a side of the substrate 110. For example, the height of the second insulating dam 520 may be higher than the height of the first insulating dam 510.

In the non-display area 600, the first spaced area SA1 may be between the organic insulating layer 530 and the first insulating dam 510. The second spaced area SA2 may be between the first insulating dam 510 and the second insulating dam 520. The third spaced area SA3 may be an outer area of the second insulating dam 520.

At least a portion the first power supply line 170 and at least a portion of the second power supply line 180 may be externally exposed in the spaced areas SA1, SA2, and SA3. Each of the first and second power supply lines 170 and 180 may have a stack structure including the first conductive part including titanium (Ti), the second conductive part including aluminum (Al), and the third conductive part including titanium (Ti). During a manufacturing procedure, due to a difference between etching ratios of aluminum (Al) and titanium (Ti), a step coverage defect may occur at the exposed portions of the first and second power supply lines 170 and 180.

Therefore, a protective layer 572 may be arranged on the portions of the first and second power supply lines 170 and 180 which are exposed in the spaced areas SA1, SA2, and SA3. The protective layer 572 may cover the exposed portions of the first and second power supply lines 170 and 180, which extend to the first, second, and third spaced areas SA1, SA2, and SA3. For example, an edge portion 170e of the first power supply line 170 and an edge portion 180e of the second power supply line 180 may be exposed in the first, second, and third spaced areas SA1, SA2, and SA3. The protective layer 572 may cover the exposed edge portion 170e of the first power supply line 170 and the exposed edge portion 180e of the second power supply line 180.

Referring to FIG. 6, in the non-display area 600, the protective layer 572 may extend from each of the exposed edge portion 170e of the first power supply line 170 and the exposed edge portion 180e of the second power supply line 180. The protective layer 572 may cover all of the first power supply line 170, the second power supply line 180, the organic insulating layer 530, and the insulating dams 510 and 520 arranged in a second direction with respect to the substrate 110.

The first power supply line 170 and the second power supply line 180 in the non-display area 600 may be on a same layer as one of the first conductive layer 175 and the second conductive layer 179 in the sub-pixel. In the present embodiment, the first power supply line 170 and the second power supply line 180 may be on a same layer as the first conductive layer 175.

Each of the first power supply line 170 and the second power supply line 180 in the non-display area 600 may have a single-conductive layer structure including at least one conductive portion on the same layer as the first conductive layer 175. For example, the first power supply line 170 in the sub-pixel has a dual-layer structure including the lower power supply line 177 on the same layer as the first conductive layer 175, and the upper power supply line 178 on the same layer as the second conductive layer 179. However, the first power supply line 170 and the second power supply line 180 in the non-display area 600 may be on a same layer as the lower power supply line 177 and may include a same material.

The protective layer 572 may be on a same layer as the inorganic insulating layer 172 for covering the first conductive layer 175. The protective layer 572 may have a single-layer structure on the same layer as the inorganic insulating layer 172 for covering the first conductive layer 175. The protective layer 572 may include an inorganic material such as silicon oxide, silicon nitride, silicon oxynitride, or the like, and may cover the first power supply line 170 and the second power supply line 180. The protective layer 572 may therefore prevent metal materials of the first power supply line 170 and the second power supply line 180 from being oxidized.

Figure 8:
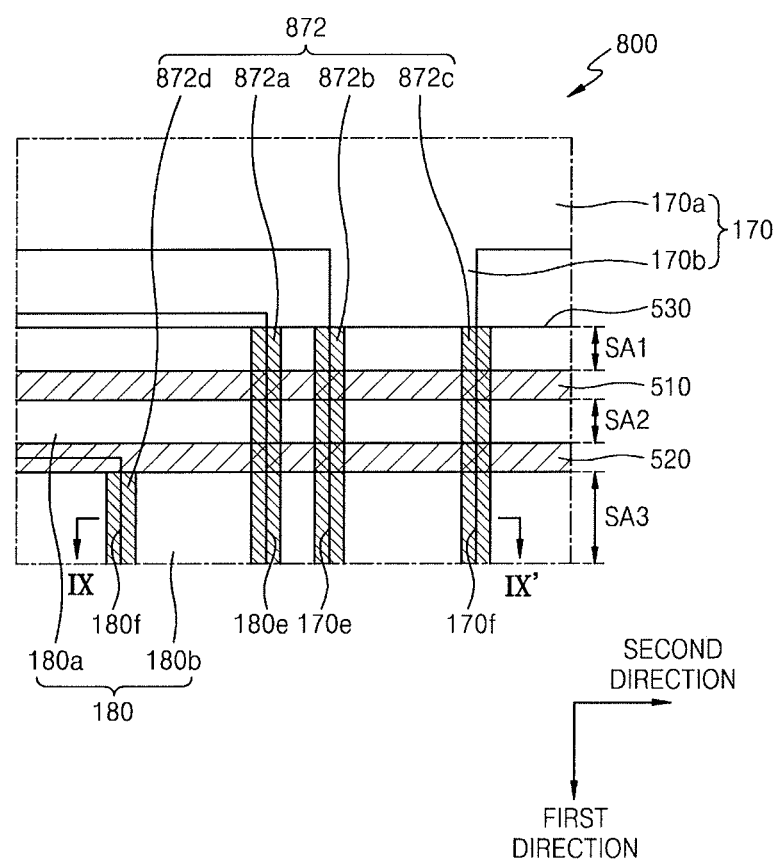
FIG. 8 illustrates another embodiment including an organic insulating layer, power supply lines, insulating dams, and a protective layer.
Figure 9:
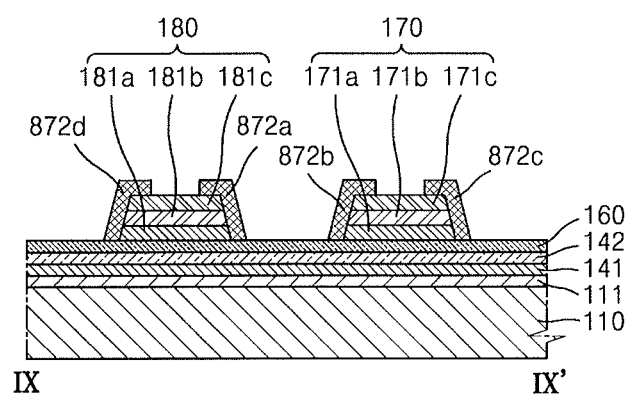
FIG. 9 illustrates a view along section line IX-IX' in FIG. 5.

FIG. 8 is a magnified plan view of an embodiment including the organic insulating layer 530, the power supply lines 170 and 180, the insulating dams 510 and 520, and a protective layer 872. FIG. 9 is a cross-sectional view of the display apparatus of FIG. 8 taken along line IX-IX'.

Referring to FIGS. 8 and 9, the power supply lines 170 and 180 may be above the substrate 110. The power supply lines 170 and 180 may be the first power supply line 170 and the second power supply line 180. The power supply lines 170 and 180 may be on a same layer as one of the first and second conductive layers 175 and 179 in the sub-pixel of FIG. 2. In the present embodiment, the power supply lines 170 and 180 may be on a same layer as the first conductive layer 175.

The first power supply line 170 may have a stack structure including a first conductive part 171a including titanium (Ti), a second conductive part 171b including aluminum (Al), and a third conductive part 171c including titanium (Ti). The second power supply line 180 may have a stack structure including a first conductive part 181a including titanium (Ti), a second conductive part 181b including aluminum (Al), and a third conductive part 181c including titanium (Ti).

The insulating dams 510 and 520 may be placed as at least one layer in an outer area of the display area DA. The insulating dams 510 and 520 are the first insulating dam 510 and the second insulating dam 520 spaced apart from each other in a second direction with respect to the substrate 110.

Spaced areas SA1, SA2, and SA3 without the organic insulating layer 530 may be arranged in a non-display area 800, which includes the power supply lines 170 and 180 and the insulating dams 510 and 520. The organic insulating layer 530 may extend from the display area DA. In the present embodiment, the organic insulating layer 530 may cover an edge of the second main line 180a. The spaced areas SA1, SA2, and SA3 may correspond to gaps between areas where the organic insulating layer 530 and the insulating dams 510 and 520 are placed, and may be arranged in open areas from which the organic insulating layer 530 has been removed.

At least a portion the first power supply line 170 and at least a portion of the second power supply line 180 may be externally exposed in the spaced areas SA1, SA2, and SA3. A protective layer 872 may be arranged on the exposed portions of the first and second power supply lines 170 and 180. The protective layer 872 may selectively cover the exposed portions of the first and second power supply lines 170 and 180 which extend to the first, second, and third spaced areas SA1, SA2, and SA3.

For example, unlike the embodiment of FIG. 6, a first protective layer 872a of the protective layer 872 may cover an exposed first edge portion 180e of the second power supply line 180. A second protective layer 872b of the protective layer 872 may cover an exposed first edge portion 170e of the first power supply line 170. A third protective layer 872c of the protective layer 872 may cover an exposed second edge portion 170f of the first power supply line 170. A fourth protective layer 872d of the protective layer 872 may cover an exposed second edge portion 180f of the second power supply line 180.

The shape of the protective layer 872 may be different among various embodiments, provided the protective layer 872 covers the exposed portions of the first and second power supply lines 170 and 180 in the spaced areas SA1, SA2, and SA3. The protective layer 872 may prevent penetration of external air and moisture through the exposed portions of the first and second power supply lines 170 and 180.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, drivers, and other processing features of the embodiments described herein may be implemented in logic which, for example, may include hardware, software, or both. When implemented at least partially in hardware, the controllers, drivers, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, drivers, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, in a display apparatus, an exposed portion of a power supply line in a non-display area may be covered by a protective layer. Therefore, a step coverage defect of the power supply line may be prevented and a penetration path of external air and moisture into a display area may be blocked.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
a protective layer;
a substrate including a non-display area adjacent to a display area;
a sub-pixel in the display area and including a conductive layer, an inorganic insulating layer on the conductive layer, an organic insulating layer on the inorganic insulating layer, and a display device connected to the conductive layer;
a power supply line including a first power supply line and a second power supply line electrically connected to the sub-pixel; and
an insulating dam as at least one layer in the non-display area, wherein the non-display area includes the insulating dam, the power supply line, and a spaced area which does not include the organic insulating layer and wherein the protective layer covers an exposed portion of the power supply line.

2. The display apparatus as claimed in claim 1, wherein:
the spaced area corresponds to an open area between an area of the organic insulating layer and an area of the insulating dam, and
the exposed portion of the power supply line is exposed in the spaced area.

3. The display apparatus as claimed in claim 2, wherein the protective layer covers the exposed portion of the power supply line which extends to the spaced area.

4. The display apparatus as claimed in claim 3, wherein:
different voltages are to be applied to the first power supply line and the second power supply line,
an edge portion of the first power supply line and an edge portion of the second power supply line are exposed in the spaced area, and
the protective layer selectively covers the exposed edge portion of the first power supply line and the exposed edge portion of the second power supply line.

5. The display apparatus as claimed in claim 4, wherein the protective layer extends from each of the exposed edge portions of the first and second power supply lines and covers all of the first power supply line, the second power supply line, the organic insulating layer, and the insulating dam which are arranged in one direction with respect to the substrate.

6. The display apparatus as claimed in claim 3, wherein:
the power supply line is on a same layer as the conductive layer, and
the protective layer is on a same layer as the inorganic insulating layer that covers the conductive layer.

7. The display apparatus as claimed in claim 6, wherein:
the conductive layer includes a first conductive layer and a second conductive layer above the first conductive layer,
the organic insulating layer includes a first organic insulating layer between the first conductive layer and the second conductive layer and a second organic insulating layer on the second conductive layer, and
the inorganic insulating layer is between the first conductive layer and the first organic insulating layer,
the power supply line in the spaced area is on a same layer as the first conductive layer, and
the protective layer is on a same layer as the inorganic insulating layer that covers the first conductive layer.

8. The display apparatus as claimed in claim 7, wherein the power supply line has a single-conductive layer structure that includes at least one conductive portion on a same layer as the first conductive layer.

9. The display apparatus as claimed in claim 8, wherein the power supply line includes a first conductive part that includes titanium (Ti), a second conductive part on the first conductive part and including aluminum (Al), and a third conductive part on the second conductive part and including titanium (Ti).

10. The display apparatus as claimed in claim 7, wherein the protective layer has a single-layer structure on a same layer as the inorganic insulating layer that covers the first conductive layer.

11. The display apparatus as claimed in claim 7, wherein the insulating dam includes a plurality of dams that are spaced apart from each other.

12. The display apparatus as claimed in claim 11, wherein:
the insulating dam is on a same layer as a plurality of organic insulating layers which include one or more of a first planarization layer corresponding to the first organic insulating layer covering the first conductive layer, a second planarization layer corresponding to the second organic insulating layer covering the second conductive layer, a pixel defining layer corresponding to a third organic insulating layer defining the sub-pixel, or a spacer corresponding to a fourth organic insulating layer placed along the sub-pixel, and
the plurality of organic insulating layers are stacked in a vertical direction with respect to the substrate.

13. The display apparatus as claimed in claim 11, wherein the dams have heights that increase toward an edge of the substrate.

14. The display apparatus as claimed in claim 7, wherein:
the first conductive layer is above the substrate,
the inorganic insulating layer is on the first conductive layer and includes an opening exposing a portion of the first conductive layer,
the first organic insulating layer is on the inorganic insulating layer and includes an opening exposing the portion of the first conductive layer,
the second conductive layer is on the first organic insulating layer, and
the second organic insulating layer is on the second conductive layer and includes an opening through which the second conductive layer is electrically connected to the display device.

15. The display apparatus as claimed in claim 7, further comprising above the substrate:
a thin film transistor including an active layer including a source region, a drain region, and a channel region connecting the source region to the drain region; and gate electrode above the active layer and insulated from the active layer, wherein the first conductive layer is electrically connected to one of the source region or the drain region.

16. The display apparatus as claimed in claim 7, further comprising above the substrate:
a pixel electrode connected to the second conductive layer;
an intermediate layer on the pixel electrode and including an emission layer; and an opposite electrode on the intermediate layer.

17. The display apparatus as claimed in claim 7, wherein:
the first power supply line includes a first main line corresponding to the display area and a first connection line extending from the first main line in a first direction, and
the second power supply line includes a second main line surrounding different ends of the first main line and other areas of the display area and a second connection line extending from the second main line in the first direction.

18. A display apparatus, comprising:
a display area;
a non-display area;
a first dam in the non-display area;

a power supply line for the display area; and a protective layer in the non-display area, the protective layer covering a portion of the power supply line not covered by the first dam in the non-display area.

19. The display apparatus as claimed in claim 18, wherein the first dam has a height sufficient to block material encapsulating the display area DA from to a side each of the non-display area.

20. The display apparatus as claimed in claim 18, further comprising:

a second dam in the non-display area, wherein the protective layer covers the power supply line in an area between the first and second dams.

\* \* \* \* \*